United States Patent [19]
Lambrache et al.

[11] Patent Number: 5,606,532
[45] Date of Patent: Feb. 25, 1997

[54] EEPROM ARRAY WITH FLASH-LIKE CORE

[75] Inventors: Emil Lambrache; George Smarandoiu, both of San Jose, Calif.

[73] Assignee: Atmel Corporation, San Jose, Calif.

[21] Appl. No.: 405,884

[22] Filed: Mar. 17, 1995

[51] Int. Cl.⁶ .................... G11C 11/40; G11C 14/00
[52] U.S. Cl. .................. 365/238.5; 365/230.02; 365/200; 365/230.08; 365/230.01
[58] Field of Search .................. 365/229, 238.5, 365/230.03, 200, 230.02, 230.01, 230.08

[56] References Cited

U.S. PATENT DOCUMENTS

| | | | |
|---|---|---|---|
| 4,949,309 | 8/1990 | Rao | 365/218 |
| 5,191,556 | 3/1993 | Radjy | 365/235 |
| 5,317,535 | 5/1994 | Talreja et al. | 365/185 |
| 5,353,248 | 10/1994 | Gupta | 365/154 |
| 5,359,569 | 10/1994 | Fujita et al. | 365/229 |
| 5,424,997 | 6/1995 | Rapp | 365/238.5 |

*Primary Examiner*—Viet Q. Nguyen
*Attorney, Agent, or Firm*—Thomas Schneck

[57] ABSTRACT

A sector programmable EEPROM memory capable of emulating the byte programmable functionality of full-featured byte programmable EEPROMs. The EEPROM memory incorporates an on-chip write cache used as a buffer between byte level data entered by the user system and word level data written to the main memory core. The EEPROM main memory core is divided into memory pages with each memory page further divided into sub-page sectors, and each sub-page sector holding a multitude of multi-byte data words. The sub-page sectors within a memory page can be individually or collectively subjected to a program and erase cycle. The EEPROM memory incorporates an ECC unit used to recover and refresh lost data in the memory core. The EEPROM memory is also capable of interruptible load cycles.

27 Claims, 6 Drawing Sheets

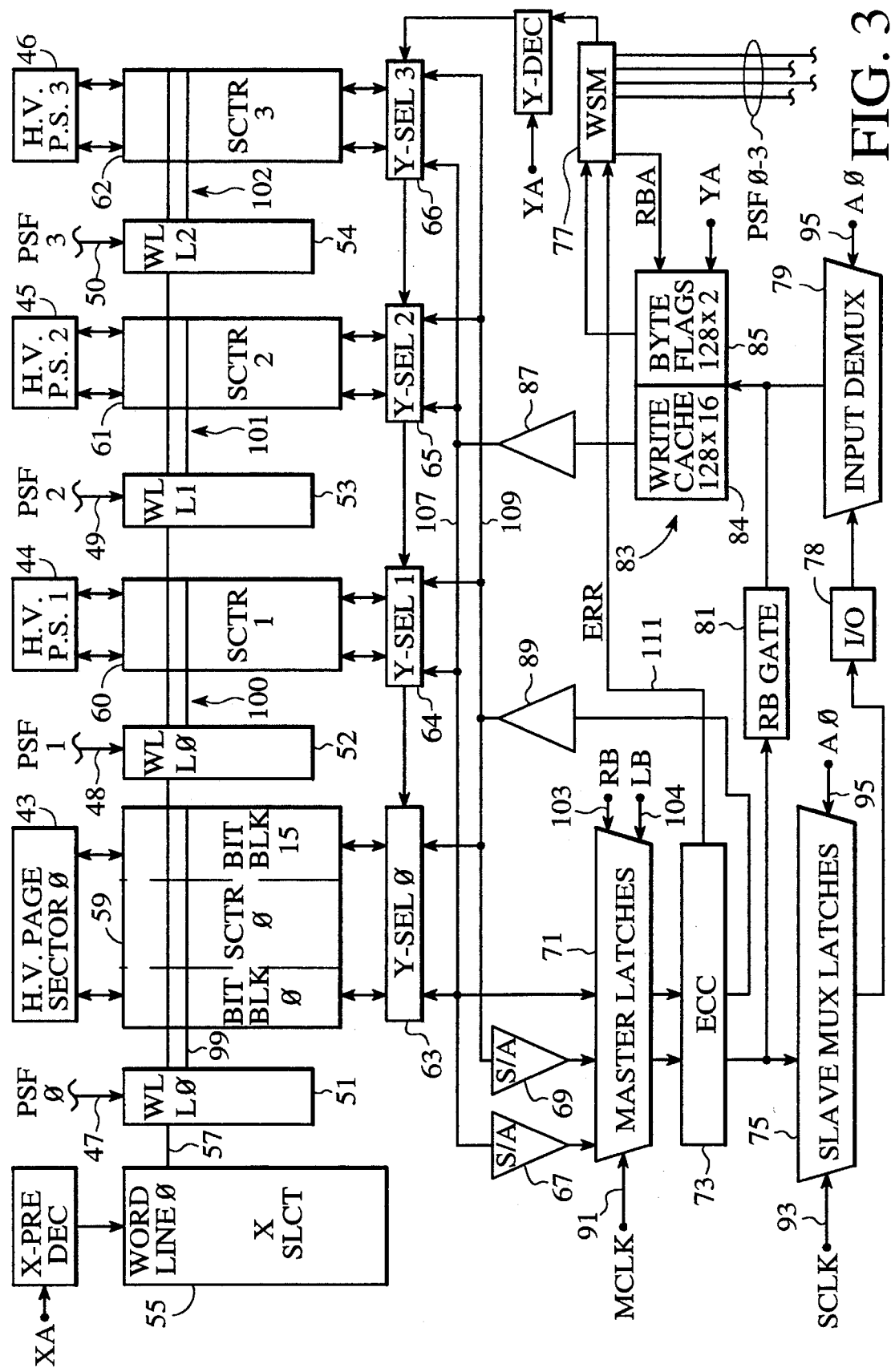

EEPROM ARRAY WITH FLASH-LIKE CORE

DESCRIPTION

1. Technical Field

The invention relates to semiconductor electrically erasable read only memories (EEPROMs), particularly to the internal architecture of such devices.

2. Background Art

EEPROMs have the ability to be electrically programmed and erased, and retain their data even after a power supply has been removed. However, they are limited in the number of times each storage cell can be programmed and erased, typically restricted to a few thousand program and erase cycles. An entire memory unit, such as a byte or group of bytes, must endure an erase cycle before new information can be written to any one bit or group of bits in a memory unit.

Full-featured EEPROMs are those EEPROMs which are part of a memory system with a memory unit size corresponding to one byte of memory cells, and therefore provide write access to a minimum of one byte of memory at a time. This allows limiting their program and erase cycles to only those bytes which need to be changed and thereby increases the endurance of the memory component. The byte accessibility of full-featured EEPROMs also simplifies programming from the user's point of view since one only needs to communicate to the EEPROM the data one wishes to program and the address where the data is to be stored. However, the need to program, erase, and then reprogram each altered byte can require long programming times if the entire chip needs to be reprogrammed. Additionally, because of their more complicated select circuitry, full-featured EEPROMs continue to lag behind other semiconductor memory technologies in terms of density and cost effectiveness. A full-featured EEPROM memory system comprises a core array of storage cells, each cell including a select transistor in series with a variable threshold NMOS transistor. The array is organized into rows and columns with the intersection of a row and column comprising the address location of a storage cell.

A typical prior art full-featured EEPROM core architecture is presented in FIG. 1. A row of memory cells identified by a dedicated word line 11 electrically coupled to the control gates of all cell select transistors 21 within one row is equivalent to a memory page in addressable space. Each cell select transistor 21 together with a serially connected variable threshold transistor 19 constitutes one memory cell capable of storing one bit of information. When a word line 11 is activated, a select transistor 21 electrically couples its serially connected variable threshold transistor 19 to a bit line 25 which is used to read the information stored in said variable threshold transistor 19. Because of the byte addressability of full-featured EEPROMs, the internal data organization of prior art full-featured EEPROMs was restricted to 8 bits, comprising one byte. A sense line 15, which applies reading, programming and erasing voltages to the control gate of a variable threshold transistor 19 of a storage cell, is broken into segments coupling together the control gates of 8 consecutive storage variable threshold transistors, or one byte 27. This data organization necessitates the use of an extra byte select column line, 13, and byte select transistor 17 for every byte of memory cells, so that by means of the byte select column lines and the byte select transistors, only one sense line segment and thereby only one byte may be individually selected during programming. The byte select transistor 17 requires a relatively large silicon area. Additionally, full-featured EEPROMs usually require some sort of error correction implementation which in order to detect and recover one lost bit of an 8 bit data word requires 4 parity bits for an increase in core memory area of about 50%. The aforestated architectural characteristics of traditional full-featured EEPROMs have so far limited their densities to one megabit.

The advent of flash EEPROMs, offered some answers to the density problems associated with full-featured EEPROMs. Flash EEPROMs utilize one or two transistors per memory cell but do not include byte select column lines and byte select transistors. In this way, flash EEPROMs achieve a more compact design than full-featured EEPROMs, but they are not byte programmable. Flash EEPROMs have minimum write units consisting of blocks or sectors of storage cells. Typically, these blocks comprise one or more rows of the memory array. Flash EEPROMs group their columns by outputs, and not by byte. That is, all bits 0 of all words are adjacent. Flash EEPROMS thus eliminate the byte select lines and the byte select transistors of full-featured EEPROMs and can thereby achieve higher densities. However, the large memory blocks of flash EEPROMs limit the life of the entire chip. In order to reprogram one byte of a memory block, the entire block must first be read to a temporary holding memory, usually a cache, the byte in question is then edited within the holding cache, the entire flash memory block undergoes an erase cycle before the data in the holding cache can be written back to the same flash memory block, thus submitting many memory cells to unnecessary erase/write cycles and making poor use of available system cache space. Additionally, the need for unnecessarily erasing/writing extra bytes can increase the average programming time of a flash chip if only a few bytes need re-programming at a time.

Some prior art devices have sought to find a compromise between full-featured EEPROMs and flash EEPROMS. U.S. Pat. No. 4,949,309 to Rao offers a chip with both full-featured and flash erase programming modes. This design eliminates the select transistor from traditional EEPROM memory cells in exchange for a more complicated word line decoding scheme, but retains the byte select lines and byte select transistors and incorporates an additional bulk erase line and bulk erase transistor for every pair of word lines. U.S. Pat. No. 5,191,556 to Radjy discloses a method for reducing the size of a flash memory block to a single memory page, one row of memory cells. U.S. Pat. No. 5,317,535 to Talreja discusses an approach for increasing the data format of EEPROMs from 8 bits to 16 bits. U.S. Pat. No. 5,353,248 to Gupta describes an SRAM with backup flash memory of equal size on the same chip. This simplifies programming, but does not make efficient use of the flash memory. U.S. Pat. No. 5,359,569 to Fujita et al. simplifies the programming of flash memory from the user's point of view by incorporating a cache memory and control unit to manage the accessing of multiple flash components at the computer board level.

It is an object of this invention to provide an EEPROM with full-featured functionality capable of achieving high densities, while reducing the number of stressful program and erase cycles a memory cell undergoes.

Another object of the invention is to improve the write-through speed of data of a full-featured EEPROM.

DISCLOSURE OF INVENTION

The present invention provides a new internal architecture for sector erasable EEPROMs in full-featured configurations. A memory array of such EEPROMs is partitioned into memory pages with each memory page further divided into a plurality of selectively erasable page sectors. Each page sector contains a plurality of individually read-addressable multi-byte data words. The page sector is the smallest program-addressable data unit. The use of page sectors reduces the number of unselected data bytes within a memory page which must undergo an erase and program cycle when another byte within the same memory page needs to be reprogrammed. Further, one needs only one select line and select device per multi-word page sector as opposed to full-featured EEPROMs which require a select line and select device for each byte of memory cells. Also, one organizes the bits within one page sector by output where all bit 0 columns within the same page sector are adjacent, and not by byte as in prior art full-featured EEPROMs Where the bits 0 to 7 of a byte have to be adjacent.

Prior art memories using an error correcting code, ECC, unit typically correct at least one bit per byte. The present invention uses an ECC unit to correct one bit per multi-byte data word, thereby reducing the number of ECC bits per data byte. Additionally, the invention incorporates automatic refreshing, transparent to the user, of any memory word which requires the use of the ECC unit to recover any misread data bit.

The invention incorporates a bank of latches to control the activation of a page sector sense line. This makes it possible to apply a high voltage to the sense line while maintaining a low voltage on the word line.

The architecture of the invention is capable of simultaneously programming and erasing any or all of the page sectors within one memory page, which physically corresponds to one memory core row. This is achieved by the addition of an on board low voltage write cache which acts as a buffer between the user and the main memory core. This improves the write-through time since the user can quickly write consecutive data words to the cache. The write cache has a multi-byte word organization related to the multi-byte word organization of the EEPROM memory core. It has a size equal to one memory page of the memory core but converts the data in-stream from byte level to multi-byte word level. The write cache accepts data from the user in byte form, and keeps track of all new data through the use of byte flags. When the user has finished entering new data, the last latched row address, high address bits, of the newly entered data determines the core memory page, i.e. row, corresponding to the entered addresses. The write cache then accepts at a multi-byte word rate through an ECC unit all the previous data from the selected memory core row into the cache memory making certain not to overwrite the newly entered data with the old data read from the memory core. By the use of page sector flags and/or the ECC error signal, ERR, the device then restores only those page sectors within the write cache which received new data or needed the ECC unit to recover lost data. The write cache has thus byte as well as multi-byte data word write-addressability and multi-byte data word read-addressability.

BRIEF DESCRIPTION OF THE DRAWINGS

FIG. 3 is a schematic block-diagram view of the EEPROM device of the present invention incorporating a memory core organized as in FIG. 2 and peripheral logic providing full-featured write access to that core.

BEST MODE OF CARRYING OUT THE INVENTION

Figure 1:
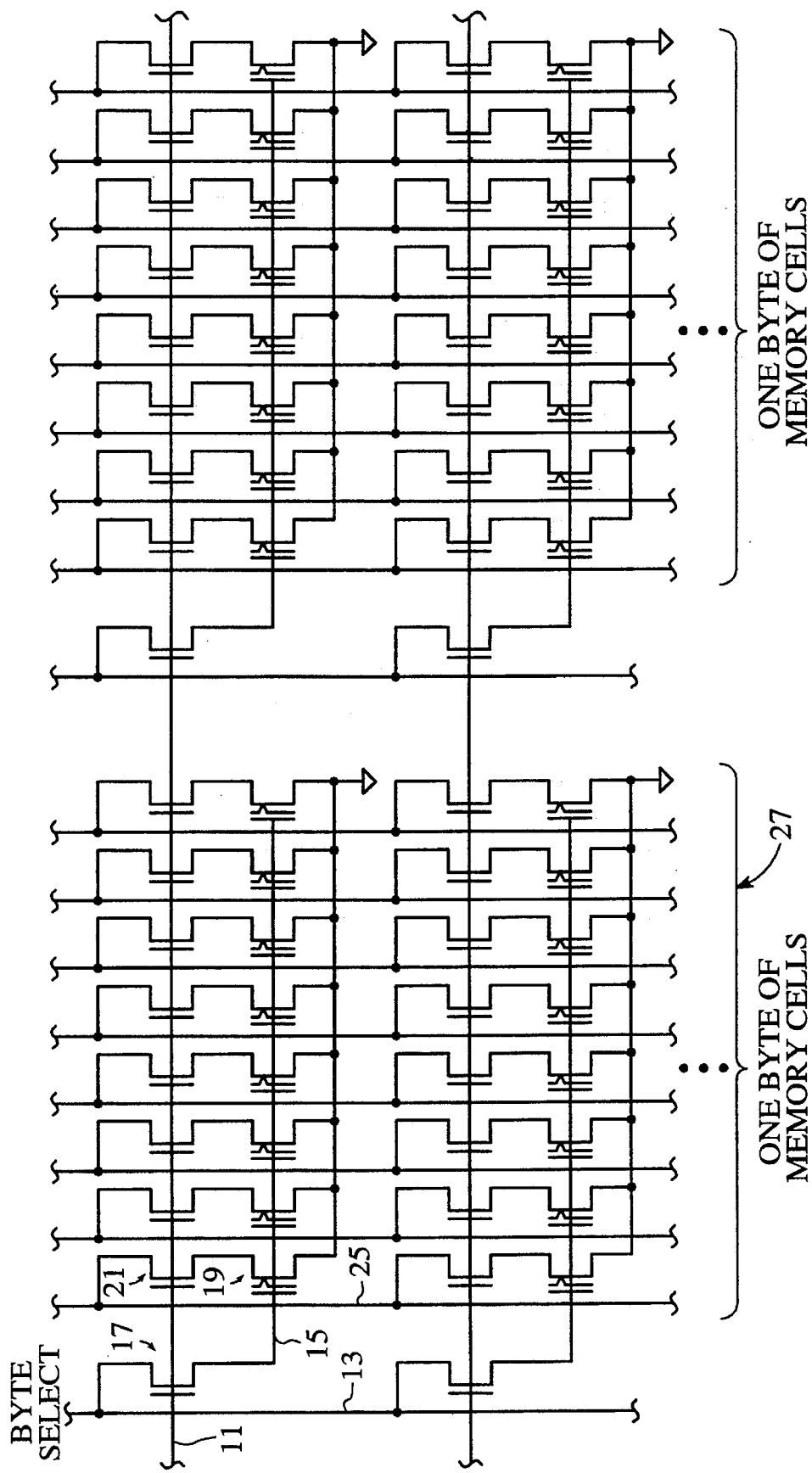
FIG. 1 is a schematic transistor-level view of a portion of a prior art fully-featured EEPROM core array.
Figure 2:
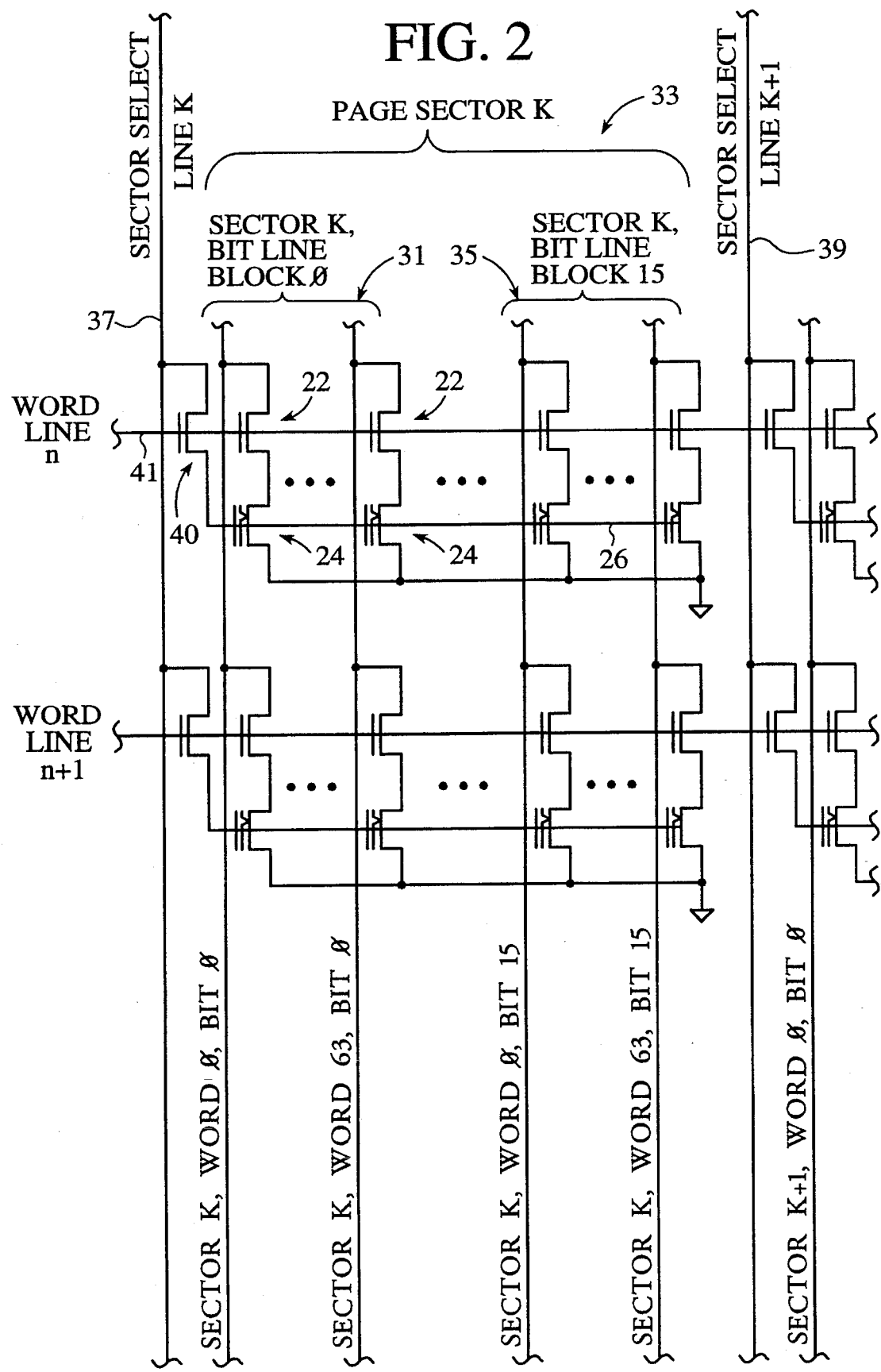
FIG. 2 is a schematic transistor-level view of a portion of a flash-like EEPROM core organized in accord with the present invention.

With reference to FIG. 2, a memory core organization specific to the EEPROM architecture of the present invention divides a memory page, i.e. all storage cells within one row, into 2,4 or more page sectors 33. Each storage cell comprises a cell select transistor 22 serially connected to a variable threshold storage transistor 24. The preferred EEPROM architecture uses a 16 bit or 32 bit internal data word architecture while maintaining 8 bit external byte read/write accessibility. The new core organization groups the bit lines not by byte or word, but by page sectors 33 with each page sector 33 consisting of multiple data words so that byte select lines and byte select transistors are no longer used. Instead, the new architecture employs a page sector select line 37 and a page sector select device 40 implemented as a select latch for each page sector 33 and thus reduces or eliminates the use of depletion mode select transistors. The above mentioned page sector select device may be implemented as a select transistor 40, as shown in FIG. 2. The data bits within each page sector 33, are arranged by rank, with bits of equal rank grouped together into blocks. Unlike prior art which grouped bits by byte such that each group of bits would consist of one bit of rank 0, one bit of rank 1, one bit of rank 2, and so on up to a bit of rank 7. In the present invention, if each page sector, 33, consists of thirty-two 16-bit words, then each page sector, 33, will be divided into sixteen bit line blocks, 31, with each bit line block consisting of 32 bits of equal rank. For example, all bits of rank 0 within a page sector 33 are grouped contiguously within bit line block 0, 31, all bits of rank 1 within the same page sector 33 are grouped contiguously in bit line block 1, not shown, and so on up to bit line block 15, 35, in the case of a 16 bit wide word organization.

With reference to FIG. 3, the new EEPROM architecture also employs an ECC mechanism, 73, Hamming code based, to detect and automatically correct any one bit error per word, 2, 4 or more bytes long, which might have occurred during a read access of the memory core. The use of a multi-byte data architecture greatly reduces the silicon area because the wider the word, the smaller the ratio between the ECC parity bits and the data bits. For example, to correct 1 bit of an 8 bit data word requires 4 parity bits for a bit-wide increase of 50% per data word, a 16 bit data word requires 5 parity bits for an increase of 31% and a 32 bit data word requires 6 parity bits for an increase of only 19%.

The present invention has an internal data architecture arranged by multi-byte words, but it communicates with a system user in bytes. As illustrated in FIG. 3, the circuit of the present invention accomplishes this through a series of multiplexing circuits, 75, which select which byte of a multi-byte word is sent out to the system user and de-multiplexing circuit, 79, for accepting byte-size data loaded in from the system user and, by means of a multiple write-clock implementation of the write-cache 83, grouping sequential byte-size data chunks into a multi-byte data word. The write cache 83 is the size of one core memory page and is implemented as an SRAM along with all its necessary control logic, such as a finite state machine and counters, to perform a read back cycle of an entire memory page during an erase/write cycle as explained below.

Programming consists of three cycles; a load cycle, a read back cycle, and a load back cycle. The programming cycle begins with a user driven load cycle during which the system user loads new data into the write cache 83. As with prior art EEPROMS, the user typically provides the load clock through the WE % pin if CE % is kept low. Alternatively, the load clock could be provided through the CE % pin if the WE % pin is kept low. At each load cycle, the corresponding byte flag of the selected byte address is activated. There are 2, 4 or more byte flags per multi-byte word, but the write cache is byte write-addressable. The WE % external clock drives an instruction decoder, not shown, which serves as an interface translating instruction modes from the system user into control signals for a Write State Machine, WSM 77. The Write State Machine 77 in turn controls the different reading and writing stages of a program and erase cycle as well as the voltages and timings needed to adequately program and erase a cell as explained below. As in prior art memory loads, the load cycle terminates with a time-out protocol.

While prior art EEPROMs have an instruction decoder to offer the system user access to the chip's internal functional modes, prior art EEPROMs limit the system user's access to only a few user modes. The new EEPROM architecture extends the usage of this instruction decoder to give the system user control of all user modes and test modes. The chip possesses an 8 bit mode register which the system user can load with a desired instruction mode ID byte through a software write protect protocol by using a predetermined dedicated sequence. The mode register is read by the instruction decoder which communicates the appropriate control signals to the WSM 74 for implementation.

Following the load cycle, programming control is transferred to the WSM 77, and it starts by initiating the read back cycle. During the read back cycle, at the page address latched at the end of the load cycle, the WSM 77 begins to read data from the corresponding core memory page as determined by a word line 57 into the write cache 83. The caches byte flags 85 are used to make sure not to overwrite any new data entered by the system user with the existing data being read from the memory core. During the read back cycle of a core memory page, the WSM 77 monitors an error signal, ERR 111 coming from the ECC unit 73 to detect if the ECC 73 has corrected at least one data word. If the ECC 73 has indeed corrected a data word then even if the user has not loaded any new data into the write cache 83, the WSM 77 will set a corresponding programming page sector flag, 47–50, and proceed to program the corrected page sector as determined by one of the page sector sense lines 99–102 thereby refreshing that page sector. In this way the data retention capability of the chip is extended. Once the core memory page has been written to the write cache 83, the WSM 77 initiates an erase phase during which the page sectors, as defined by a corresponding page sector sense line 99–102, which have their page sector flag 47–50 activated will be erased. In this way, only the core memory page sectors which received new loaded data or which required the ECC 73 unit to recover lost data are erased. Therefore the chip will update only the page sectors which satisfy at least one of the following conditions: (1) The user has loaded at least one new byte in the corresponding page sector of the write cache 83; (2) During the read back cycle, the transfer of a page sector from the memory core into the write cache 83 used the ECC 73 to correct at least one error. If none of the page sectors satisfy any of the previously stated conditions, the chip will abort the programming cycle altogether. But if either of the conditions is met, the chip will reprogram only the selected page sectors, thus avoiding unnecessary stress on the core memory page and consequently improving the endurance of the EEPROM as compared to a prior art Flash EEPROM endurance levels.

The WSM 77 now begins the load back cycle during which it transfers the data from the write cache 83 to the high voltage page sectors 43–46 in preparation of programming the corresponding core memory page sectors. During the load back cycle, the ECC unit 73 generates new parity bits for each data word in the write cache and sends the new parity bits to the high voltage page sectors 43–46, to be written into the memory core along with the data from the write cache. Once the WSM 77 finishes loading the high voltage page sectors 43–46, it applies high programming voltage only to those page sectors which are to be written to as determined by the previously stated conditions. With programming complete, the WSM 77 transfers control back to the address transition detection, ATD, circuit, not shown, which uses the transition of an address to synchronize the memory component's internal clock to the system external clock so that the chip may resume normal read mode.

With reference to FIG. 3, the memory core is segmented according to the memory page segmentation. A word line 57 coming from the X-Select decoder 55 defines a memory page and is coupled to all word line latch banks, 51–54, and memory sectors 59–62. Each memory sector 59–62 consists of a multitude of page sectors with each page sector individually defined by a page sector sense line 99–102. A word line latch bank 51–54 is coupled only to its corresponding memory sector 59–62 through its own page sector sense line 99–102. For example, word line latch bank "0", 51 is coupled only to page sectors within memory sector "0", 59 through its page sector sense lines 99. In normal programming, any combination of word line latch banks 51–54 can be active and thereby raise the page sector sense line of the selected page sector to the internal high programming voltage. The byte select transistor of prior art full-featured EEPROM architecture has been replaced by a sector select latch, driven by the page sector flags 47–50 and by the selected word line latch banks 51–54.

Above the memory core there are the high voltage page sectors 43–46, a row of latches which selectively can raise the bit lines to the internal high voltage level.

Below the memory core is the new architecture developed to control the data path necessary during a normal read cycle, read back cycle, load cycle, and load back cycle. The architecture can best be explained by discussing the data path of a normal read cycle and a program instruction.

During a read cycle, which is controlled by the ATD circuit, not shown, data is read by sense amps 67 and 69 through active Y-select pass transistors 63–66. Data bits are read by sense amps 67 and parity bits are read by sense amps 69. When the sensing time is up, the master clock signal, "MCLK" 91, goes low and latches an entire word, data plus parity bits, into a master latch register 71. At the latest, beginning with the high to low MCLK transition, the ECC 73 matrix starts evaluating the raw data presented to it by the master latch register outputs. The slave clock signal, "SCLK" 93, which is out of phase with MCLK, goes high and lets the ECC outputs into the slave latch multiplexer register 75. This register accepts the corrected data word from the ECC outputs and selects only one byte from the multi-byte data word by using the least significant address bits, 95, A0 for a 16-bit-wide word or A1 and A0 for a 32-bit-wide data word. The outputs from the slave latch multiplexer register directly drive the chip output buffers 78, which additionally get their enable from the OE % pin. At the next address change detected by the ATD circuit, SCLK goes low, thus providing a controlled old data hold time equal to the sensing time of the new data. MCLK goes high to let the sense amps 67 and 69 propagate their new outputs into the master latch register.

The MCLK and SCLK internal clock signals are generated by an address transition detection, ATD, circuit, not shown, which synchronizes the chip read cycle with the system clock. It also protects the chip against the internal power rail noise generated by the high output switching currents.

The programming instruction begins with a user driven load cycle during which input data from the system user is loaded into a low voltage SRAM write cache 83 instead of being loaded directly into a high voltage page as in prior art. The write cache 83 is organized by words 84 plus byte flags 85, but is byte-writable so when the user enters data in bytes, an input demultiplexer 79 presents to the write cache the appropriate byte, as determined by the lower address bits 95, to be arranged into a multi-byte word. The write cache distinguishes new data entered by the user from old data read from the memory core by associating a ninth bit, byte flag, to each byte of a word. At the beginning of a load cycle, for example, all byte flags are set meaning that at this moment all data in the write cache is trash and can be replaced by data from the core memory when the read back cycle is initiated. With each load access made by the system user, the byte flag corresponding to the selected byte address inside the page is reset so that these addresses will not be written to from the core memory during the read back cycle. Thus the write cache 83 will contain the new loaded data when the load back cycle is initiated and the write cache 83 starts loading its contents to the high voltage page sectors 43–46 in preparation of writing to the core memory.

Each word line latch bank 51–54 has its own page sector flag 47–50. At the beginning of a load cycle, all page sector flags 47–50 are reset meaning that no word line latch bank 51–54, and consequently no page sector, is enabled. If at least one byte is loaded into a page sector of the write cache 83, the corresponding page sector flag 47–50 is set thereby enabling the word line latch bank which controls the corresponding core memory page sector as defined by a page sector sense line 99–102. The load cycle is terminated through a time-out period protocol as in prior art.

Figure 4A:
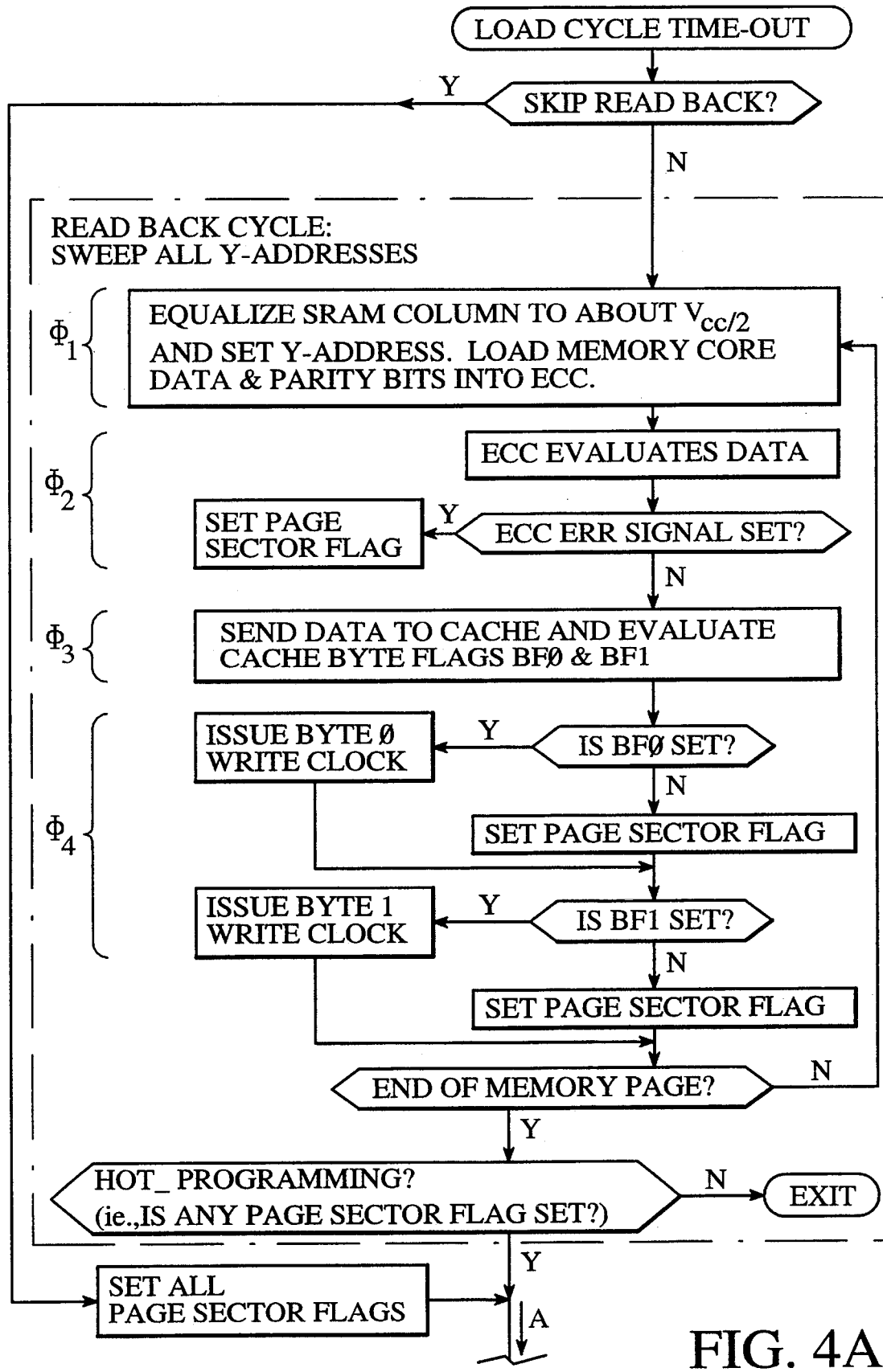
FIGS. 4A–4C shows an operational flow chart of a write state machine in accord with the present invention.
Figure 4B:
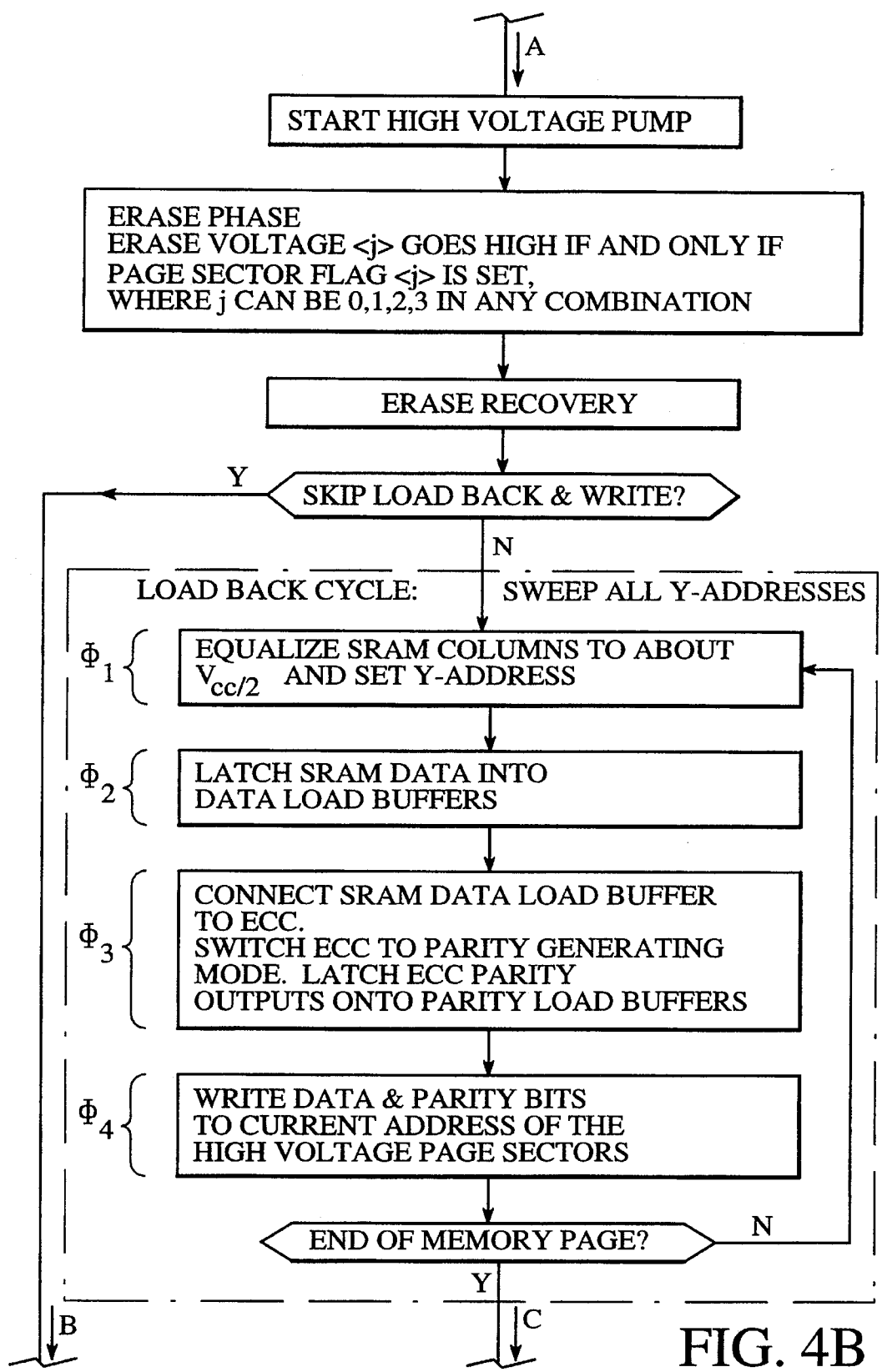
Figure 4C:
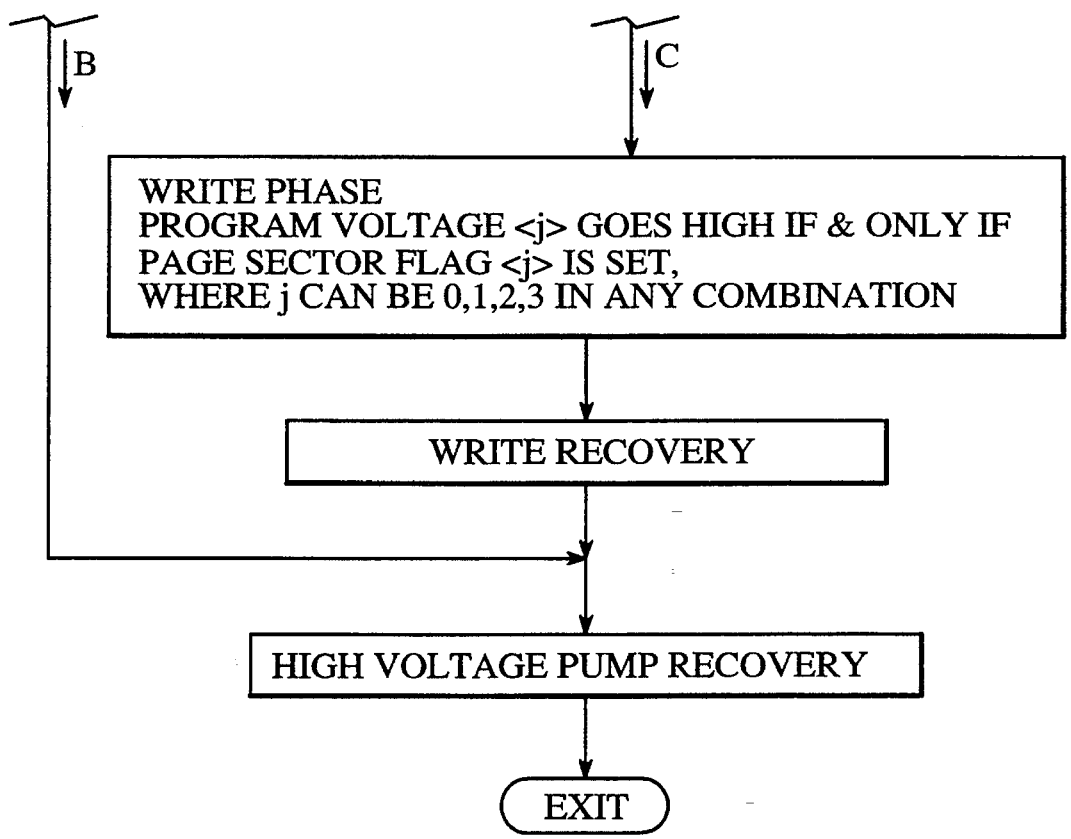

From this moment, the programming control belongs to the write state machine 77. The WSM has the capability of driving the internal word address bits in order to sweep the write cache 83 and the selected core memory page through the Y-select pass transistors 63–66. FIGS. 4A–4C show an operational flow chart of the WSM including the instruction path taken under various instruction modes. For a programming instruction mode, following the load cycle time-out period, the WSM initiates a read back cycle. Each read word-step in the read back cycle has 4 phases as described below.

Phase 1: The SRAM columns are equalized at about VCC/2. It is during this equalization time that the WSM 77 may change the word addresses without upsetting the SRAM content. With an updated word address, the core is accessed by the data sense amps 67 and by the parity sense amps 69 and old raw data plus parity bits are presented to the ECC circuit 73.

Phase 2: When the ECC 73 has completed error correction, it will have valid data on its outputs and a set error signal, ERR 111, if the raw data had to be corrected. At the same time, the SRAM latches the byte flags onto its outputs and will maintain them latched until the next word-step.

Phase 3: The read back, RB, gate 81 connects the ECC 73 outputs to the write cache 83 inputs while the WSM 77 evaluates the byte flags.

Phase 4: Each byte in a word has its own SRAM write clock signal, not shown, which arrives from the WSM 77 only if the corresponding byte flag has been read as set during the previous phase. If the byte flag has been read as reset, meaning that this location contains newly loaded data, the write cache SRAM will not receive a write clock for the corresponding byte, so the new loaded data will be preserved in the write cache.

During the entire read back cycle, the WSM 77 monitors the ECC error signal, ERR 111 as shown in phase 2 of FIG. 4A. When a word is read back with the usage of the ECC 73 to correct it, the ERR 111 signal is set and the WSM will set the page sector flag 47–50 of the corresponding word line latch bank 51–54 if not already set by the load cycle.

The WSM 77 now starts an on chip high voltage pump, not shown, and then initiates the erase phase. Only the word line latch banks 51–54 with set page sector flags 47–50 will receive the erasing voltages. The corresponding core memory page sectors get erased. The WSM 77 also polls the on chip timer, not shown, to finish this erase phase. At the end of erase time, the WSM 77 performs an erase recovery, i.e. discharges the high voltage on the selected sense line sector segments.

Next, the WSM 77 starts the load back cycle. Again it sweeps the word address space and again each load word-step has 4 phases as defined below.

Phase 1: The SRAM columns are equalized at about VCC/2. It is during this equalization time that the WSM may change the word addresses without upsetting the SRAM content.

Phase 2: The SRAM sense amps, not shown, read the new data, which until the next word-step will stay latched on the SRAM outputs, 87.

Phase 3: The ECC 73 is switched into parity generating mode, and its inputs are connected to the SRAM outputs 87 through the data bus, 107. This multiplexing function is delivered by the master latch register 71, which has dual inputs controlled by the read back signal RB 103 and the load back signal LB 104. Both RB and LB are controlled by the WSM. At the end of Phase 3, the ECC 73 output parity bits 89 are ready, and present the valid new parity information to be written together with the SRAM data bits, 87.

Phase 4: The SRAM outputs drive the data load buffers 87 and the ECC parity outputs drive the parity load buffers 89, which write the new word into the high voltage page sectors 43–46 through the appropriate Y-select pass transistors 63–66 and core bit lines.

The WSM 77 initiates the write phase. Again, only word line latch banks 51–54 with set page sector flags 47–50 will send a high programming voltage onto their page sector sense line 99–102. Within each active memory sector 59–62, only the bit lines with set high voltage page latches will actually get the high voltage and thus write to the storage cells on the selected core row. The selected word line 57 also gets the high voltage. The WSM 77 polls the on chip timer to finish this write phase. At the end of the write time, the WSM 77 performs a bit line recovery, i.e. discharges the high voltage on the selected bit lines, and then a word line recovery. The WSM 77 now discharges the on chip high voltage pump, and upon exit passes the chip control to the ATD circuitry so that the chip may resume the read mode.

The circuit of the present invention also implements interruptible load cycles by introducing 3 new bits to the prior art method of polling the write status of a WSM 77. At the beginning of a load cycle, all 3 new status bits are reset and get set at different points during a write cycle as described below.

Bit: LOAD TIME-OUT WARNING—Is set after 75% of the total time-out period of a load cycle has expired, and remains set until the exit of the WSM.

Bit: ERASE ACTIVE—Is set during the read back and erase phases.

Bit: WRITE ACTIVE—Is set during the load back and write phases.

A typical interruptible load cycle would follow this flow:

Part 1: The user system initiates a write cache clear plus load only cycle by loading a mode ID which clears the write cache SRAM and tells the chip not to proceed with the core updating upon completion of the load cycle. If during this load cycle, a higher priority interrupt request arrives, the user system can safely grant the interrupt request and postpone this load cycle. Upon exit of the other process, the user system should use the status query capability as follows:

Check if the toggle bit is still active, meaning that the WSM is still active, by successive read cycles at the same address. If the toggle bit is toggling, then the user system should check the LOAD TIME-OUT WARNING bit. If it is still reset, then the user system still has at least 25% of the total load cycle time-out period to finish loading data, and so can safely resume the Load cycle. If the toggle bit is toggling but the LOAD TIME-OUT WARNING bit is already set, than the user system should let the chip complete the time-out interval and attempt to resume loading after the toggle bit ceases toggling indicating that the WSM is no longer active.

If the toggle bit is no longer active, then the user system can proceed with part 2.

Part 2: A Load Only should be loaded as mode ID to continue the loading cycle with the interrupt capability. The handshake provided by the status query should be used as described above.

Part 3: Upon completion of the load cycle, i.e. when despite all interrupts the user system has managed to load all the new bytes in the selected page, or when the user system can disable all higher priority interrupts, a final load plus programming mode ID can be given to the chip to let it update the core with the new data loaded in the write cache.

The final load can actually be empty. The chip will observe the regular load cycle time-out interval and proceed with programming. It is precisely because the final load cycle can be empty, that the final load mode can be interrupted. Since the chip is using the on chip timer to count the load time-out, an interrupt will not prevent the chip from entering programming. In fact, immediately after giving the final load plus programming mode ID, the user system can proceed serving another process.

We claim:

1. An electrically erasable programmable read only memory, EEPROM, array comprising:

a main memory core configured as an array of EEPROM memory cells partitioned into erasable and programmable sub-page sectors, each sub-page sector defined by a sector select line coupled through a sector select device to a sector sense line in turn coupled to all storage devices within a sub-page sector, each sub-page sector individually addressable through said sector select device, each sub-page sector being an integral divisor of a memory page, with each sub-page sector being divided into a plurality of individually read-addressable multi-byte data words, the main memory core having a high voltage supply accessible through a high voltage page, external input and output data leads, input address leads, a write enable lead and a chip enable lead with the address and data leads internally coupled to a write cache, the write cache being coupled to the main memory core, and an error correction control, ECC, unit having multiplexed inputs coming from the memory core and the write cache, add multiplexed outputs coupled to the write cache and the memory core, said outputs representing data and parity bits.

2. The memory of claim 1 wherein each of said storage devices includes a cell select transistor in series with an electrically erasable and programmable memory device.

3. The memory of claim 1 wherein all sub-page sectors are of equal size.

4. The memory of claim 1 wherein the sector select device is a latch.

5. The memory of claim 1 wherein the sector select device is a select transistor.

6. The memory of claim 1 wherein the write cache comprises a plurality of SRAM devices.

7. The memory of claim 1 wherein the write cache comprises a low voltage cache.

8. The memory of claim 1 wherein the write cache has a size equal to the size of one memory page.

9. The memory of claim 1 wherein the write cache has means for accepting a separate write control signal for each byte of a multi-byte word.

10. The memory of claim 1 wherein said multiplexed outputs from said ECC unit are selectively coupled to said input and output data leads.

11. The memory of claim 1 wherein the ECC unit has means for generating output signals indicating when a data word has corrupted data.

12. The memory of claim 1 wherein a ratio of ECC bit count to data word bit count is below 50%.

13. An electrically erasable programmable read only memory, EEPROM, comprising:

a plurality of memory cells arranged into an array of rows and columns, said memory cells further grouped into a plurality of memory units, each memory unit comprising a data word section and a parity bit section;

a data bus for accessing a data word section of a memory unit;

a parity bus for accessing a parity bit section of a memory unit;

a master latch for selectively latching in said data bus and parity bus;

an error correction control, ECC, unit for receiving said latched in data bus and parity bus from said master latch, said ECC unit selectively generating one of either a corrected data word corresponding to said parity bit section or a new set of parity bits corresponding to said data word section;

an output data routing means for selectively routing said corrected data word from said ECC unit to a set of input/output leads; and a parity bit routing driver for selectively coupling said new set of parity bits from said ECC unit to said parity bus.

14. The memory of claim 13 wherein said data word section includes more than one byte.

15. The memory of claim 13 further comprising a write cache, said write cache having output means coupled to said data bus, and said write cache selectively receiving said corrected data word from said ECC unit.

16. The memory of claim 15 further comprising an input data routing means receiving byte-size inputs from said input/output leads, arranging said byte-size inputs into a data input word of size equal to a data word section of a memory unit and storing said data input word into said write cache.

17. The memory of claim 16 wherein said write cache further comprises flag bits, said flag bits being set in response to a data input word from said input data routing means being stored in said write cache.

18. The memory of claim 17 further comprising a write state machine coupled to monitor said ECC unit, and wherein said write state machine sets one of said flag bits in said write cache in response to the ECC unit generating a corrected data word.

19. A non-volatile silicon memory comprising:
- a main memory core configured as an array of memory cells, said memory cells being grouped into memory units;
- a data bus for accessing a data word section of a memory unit;
- a parity bus for accessing a parity bit section of a memory unit;
- a master latch for selectively latching in said data bus and parity bus;
- an error correction control, ECC, unit for receiving said latched in data bus and parity bus from said master latch, said ECC unit selectively generating one of either a corrected data word corresponding to said parity bit section or a new set of parity bits corresponding to said data word section;
- an output data routing means for selectively routing said data word from said ECC unit to a set of input/output leads; and
- a write cache having output means coupled to said data bus and having input means coupled to selectively receive said corrected data word from said ECC unit.

20. The memory of claim 19 wherein said array of memory cells are partitioned into erasable and programmable sub-page sectors, each sub-page sector defined by a sector select line coupled through a sector select device to a sector sense line in turn coupled to all storage devices within a sub-page sector, each sub-page sector individually addressable through said sector select device, each sub-page sector being an integral divisor of a memory page, with each sub-page sector being divided into a plurality of said memory units, said memory units being individually addressable and consisting of a data word section and a parity bit section.

21. The memory of claim 19 wherein a ratio of the parity bit section in a memory unit to the data word section in a memory unit is below 50%.

22. The memory of claim 19 further comprising a parity bit routing driver for selectively coupling said new set of parity bits from said ECC unit to said parity bus.

23. The memory of claim 20 wherein said write cache is arranged into a plurality of one byte-size data units and the input means of said write cache is effective for selectively sequentially receiving a byte of a multi-byte data word from said ECC unit.

24. The memory of claim 19 wherein said write cache has a size smaller than said memory core.

25. The memory of claim 19 further comprising an input data routing means receiving byte-size inputs from said input/output leads, arranging said byte-size inputs into a multi-byte data input word and storing said multi-byte data input word into said write cache.

26. The memory of claim 25 wherein said write cache further comprises flag bits, said flag bits being set in response to a multi-byte data input word from said input data routing means being stored in said cache.

27. The memory of claim 19 wherein said write cache sets a flag bit in response to the ECC unit generating a corrected data word.

* * * * *